United States Patent [19]

Lee

[11] Patent Number: 4,472,694

[45] Date of Patent: Sep. 18, 1984

[54] ACOUSTIC SURFACE WAVE DEVICE

[75] Inventor: Ching W. Lee, Lexington, Mass.

[73] Assignee: GTE Laboratories Incorporated, Waltham, Mass.

[21] Appl. No.: 415,288

[22] Filed: Sep. 7, 1982

[51] Int. Cl.³ .................... H03H 9/25; H03H 9/64; H03H 9/145

[52] U.S. Cl. .............................. 333/194; 310/313 C; 333/151; 333/196

[58] Field of Search ........................... 333/150-155, 333/193-196; 331/107 A; 310/313 R, 313 A, 313 B, 313 C, 313 D

[56] References Cited

U.S. PATENT DOCUMENTS

| | | | |
|---|---|---|---|
| 4,139,791 | 2/1979 | Yamada et al. | 333/150 X |
| 4,162,415 | 7/1979 | Andreev et al. | 333/193 X |
| 4,322,651 | 3/1982 | Inoue et al. | 310/313 C X |
| 4,350,963 | 9/1982 | Iwamoto et al. | 333/194 X |
| 4,354,129 | 10/1982 | Ieki | 310/313 C |

Primary Examiner—Marvin L. Nussbaum
Attorney, Agent, or Firm—David M. Keay

[57] ABSTRACT

An acoustic surface wave filter device having an input transducer of interleaved overlapping electrode structure. Acoustic surface wave absorbing material is disposed on a region of the electrodes within the overlap envelope and back of the electrodes having the maximum amount of overlap. The absorbing material suppresses waves traveling backward in the transducer thus greatly reducing the problem of spurious signals caused by acoustic reflections from the edges of the electrodes within the overlap envelope.

7 Claims, 6 Drawing Figures

ACOUSTIC SURFACE WAVE DEVICE

BACKGROUND OF THE INVENTION

This invention relates to acoustic surface wave devices. More particularly, it is concerned with acoustic surface wave devices employed as filters.

Acoustic surface wave devices employing piezoelectric materials having suitable properties for propagating surface waves and having transducers for launching and receiving acoustic surface waves in the material are well known. Typically, the transducers are arrays of interleaved conductive electrodes deposited on a substrate of the material. In response to electrical signals an input or transmitting transducer launches acoustic surface waves along a predetermined path on the surface of the substrate. An output or receiving transducer detects the acoustic surface waves and generates electrical signals in response thereto. Typically, acoustic surface wave devices have been employed as delay lines and as filters. Because of the frequency response which can be obtained in an acoustic surface wave device by suitably designing the configuration of the transducer electrodes, particularly desirable bandpass characteristics can be achieved such as that required of an intermediate frequency filter for use in television receivers.

In the development of acoustic surface wave devices for use as filters various problems have been encountered. Several secondary effects are present which tend to degrade the performance of the device. Various techniques have been employed to compensate or avoid certain of these secondary effects.

One undesirable secondary effect is known as wave front distortion. In order to obtain the desired frequency response for certain types of filters the electrodes of the input transducer extending in opposite direction from two bus bars are arranged to overlap. With varying overlap the number of metal electrodes traversed by a surface wave moving along its path of propagation varies across the span of the transducer aperture. Since the velocity of acoustic surface waves is affected by traveling under a metallized surface, the result is wavefront distortion. It has been found that the secondary effect can be avoided by the use of so-called "dummy" or inactive electrodes which extend toward each active electrode from the opposite bus bar so as to provide an overall generally rectangular configuration of the transducer. Thus, all acoustic surface waves generated within the overlap region of the transducer aperture traverse essentially the same amount of metallized surface as they pass along the propagation path through the transducer.

Another secondary effect is acoustic reflections caused by impedance discontinuities in the propagating medium. This problem is corrected by the use of dual element electrodes in place of single element electrodes. With single element electrodes the electrodes are generally one-fourth of the principal wavelength wide and adjacent electrodes are generally separated by one-fourth of a wavelength. With the two element electrodes each element is one-eighth of a wavelength wide and adjacent elements are separated by one-eighth of a wavelength. The double element electrode configuration causes undesirable acoustic reflections to cancel each other. This technique is well known and widely used to suppress what is known as triple transit echos.

Another secondary effect is caused by reflections occurring at the edges of the electrodes with either single element or two element electrodes. Although double element electrode structures are efficient in suppressing reflections at the center frequency of the device, this action degrades gradually outward from the center frequency. In many types of acoustic surface wave devices the electrode structure is weighted as to amplitude and phase, that is, the length of the electrodes is varied to vary the overlap and the spacing between the electrodes is varied to produce phase weighting. The problem of reflections from electrode edges may be exaggerated in devices of this type. Although individual edge reflections are small, they can add in phase to significant values to become noticeable spurious signals.

One structure which greatly reduces the problem of spurious signals caused by acoustic reflections from the edges of the electrodes is disclosed and claimed in U.S. Pat. No. 4,205,285 which issued to Martin E. Dempsey and Ching W. Lee on May 27, 1980. In the input transducer the major portions of the inactive electrodes and of the active electrodes which lie outside the overlap envelope and also the bus bars are combined into continuous uninterrupted metal layers. With this structure electrode edges outside of the overlap envelope are reduced significantly, thus greatly reducing the problem of spurious signals caused by acoustic reflections from the edges. However, since the active electrodes within the overlap envelope are designed to generate or detect acoustic surface waves, they cannot be removed or replaced by solid conductive material. Distortion of the desired signal caused by reflection at the edges of the electrodes within the overlap envelope can be significant, particularly with substrates of propagating materials which have strong electrical to mechanical coupling, such as lithium niobate.

SUMMARY OF THE INVENTION

Acoustic surface wave devices in accordance with the present invention provide operation with reduced spurious signals from electrode edge reflections. The device includes an acoustic surface wave propagating medium with an input transducer on a surface of the medium for launching acoustic surface waves along a propagation path in the medium. An output transducer is located on the surface of the medium for receiving and detecting acoustic surface waves propagated along the propagation path from the input transducer. The input transducer comprises first and second sets of interleaved electrodes of conductive material on the surface of the acoustic surface wave propagating medium with the electrodes extending transversely to the propagation path of the acoustic surface waves through the input transducer towards the output transducer. Portions of the electrodes of the first set overlap portions of the electrodes of the second set with the length of the overlapping portions varying along the direction of the propagation path. The overlapping portions of the electrodes define an overlap envelope. Acoustic surface wave absorbing material is disposed on a region of the electrodes of the input transducer within the overlap envelope and between the electrodes having the maximum amount of overlap and the end of the input transducer which is remote from the output transducer.

The absorbing material suppresses acoustic surface waves generated throughout the input transducer and traveling backward away from output transducer. The absorbing material also decreases the magnitude of the forward propagating acoustic surface waves launched from those active electrodes under the absorbing material. Therefore, the region on which the absorbing material is disposed should not extend forward of the maximum electrode overlap. Proper design of the input transducer can compensate for the effects on the forward traveling waves generated by the electrodes under the absorbing material. Thus, the net effect of the absorbing material is to reduce the spurious signals produced by reflections from the electrode edges, particularly those due to backward traveling waves.

Figure 1:
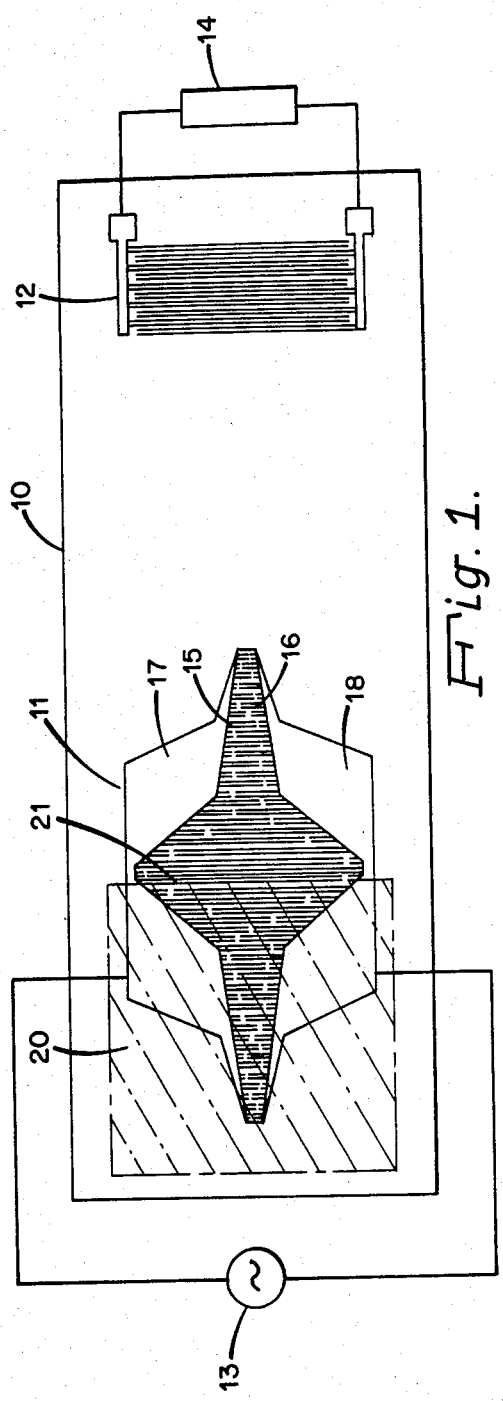
FIG. 1 is a schematic representation of an acoustic surface wave filter device in accordance with the present invention.
Figure 1A:
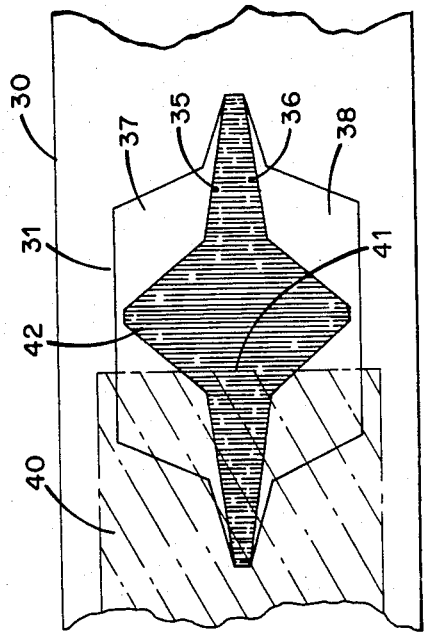
FIG. 1A is a schematic representation of a fragment of a modification of the acoustic surface wave device of FIG. 1.

It should be noted that FIGS. 1 and 1A are schematic representations and thus do not show precisely the actual configuration, spacing, or number of conductive elements as present in actual devices.

For a better understanding of the present invention, together with other and further objects, advantages, and capabilities thereof, reference is made to the following disclosure and appended claims in connection with the above-described drawing.

DETAILED DESCRIPTION OF THE INVENTION

FIG. 1 is a schematic representation of an acoustic surface wave device in accordance with the present invention. The device includes a substrate 10 of a suitable acoustic surface wave propagating material, for example, PZT, lithium niobate, or lithium tantalate. An input or transmitting transducer 11 of conductive material is deposited on the surface of the substrate 10 for launching acoustic surface waves along a propagation path in the substrate. An output or receiving transducer 12 is located across the propagation path in order to receive acoustic surface waves generated by the input transducer 11. A source of electrical signals 13 is connected to the input transducer 11 and the output transducer 12 is connected to a load 14.

The input transducer 11 as illustrated in FIG. 1 includes two sets of interleaved conductive electrodes 15 and 16 deposited on the surface of the substrate of wave propagating material 10. As indicated in the figure, each electrode consists of two conductive elements and the electrodes are appropriately apodized and also weighted as to width and separation to produce a desired frequency response. Weighting of the interleaved electrodes by length results in an overlapping electrode structure with the overlapping portions defining an overlap envelope. The electrodes having the maximum amount of overlap 21 define the acoustic aperture of the transducer across which the wavefront of the waves produced by the transducer extends. Each of the active electrodes is opposed by an inactive or dummy electrode from the opposite set of electrodes which extends toward it with a small gap in between.

The input transducer 11 includes two continuous uninterrupted films or layers of conductive material 17 and 18 on the surface of the substrate. The layers 17 and 18 lie on opposite sides of the input transducer and serve as bus bars to which the signal source 13 is coupled and from which the active and inactive electrodes of each set extend. The inner edges of the conductive surface layers 17 and 18 generally follow the electrode overlap envelope and thus the layers extend within the acoustic aperture of the transducer. The configuration of the conductive layers 17 and 18 is such that the wave generated by each active electrode traverses equal amounts of conductive material at all points across the acoustic aperture. With this structure edge reflections outside the active area of the overlap envelope are greatly reduced. Details of this structure and its advantages are further discussed in the aforementioned patent of Dempsey and Lee.

The input transducer 11 converts electrical energy from the source 13 to mechanical acoustic surface waves which propagate along the propagation path in the medium in a direction transverse to the direction in which the electrodes extend.

The output transducer 12 as shown in FIG. 1 also includes two sets of interleaved electrodes, each electrode being a double element. The electrodes are illustrated as being of equal length, although they may also be weighted. The width of each element and the spacing between adjacent elements is one-eighth of the wavelength of the resonant frequency of the device. The output transducer 12 receives the acoustic surface waves propagated toward it along the propagation path, detects them, and converts them into electrical signals which are applied to the load 14 connected across the two sets of electrodes.

In acoustic surface wave devices in accordance with the present invention a layer of an acoustic surface wave absorbing material 20 is placed over a region of the electrodes of the input transducer 11 within the overlap envelope. As shown in FIG. 1 the absorbing material 20 covers all of the active electrodes from adjacent to the electrodes having the maximum amount of overlap 21 to the end of the transducer remote from the output transducer 12. The absorbing material 20 may be any of various well known materials which are good absorbers of acoustic surface waves and have large internal losses. Among the materials found useful are silicon rubber, epoxy resin, a mixture of silicon rubber and epoxy resin, each of the foregoing mixed with an oxide powder, and wax. The acoustic surface wave absorbing material 20 suppresses or dampens the acoustic surface waves traveling backward in the input transducer 11 and thus their forward traveling reflections from the electrode edges. Any unwanted effects on the forward propagating waves generated by the electrodes under the absorbing material may be compensated for by appropriate design of the apodized electrode structure.

FIG. 1A illustrates a modification of the input transducer of FIG. 1. Input transducer 31 having similar sets of interleaved electrodes 35 and 36 and bus bars 37 and 38 is fabricated on a suitable substrate 30 of acoustic surface wave propagating material. The overlap envelope defined by the apodized electrodes includes a series of loops along the direction of the propagation path. A region of the active electrodes is covered by a layer of acoustic surface wave absorbing material 40. The region extends from adjacent to the electrodes 41 at the end of the loop which encompasses those electrodes 42 having the maximum amount of overlap to the end of the input transducer 11 which is remote from the output transducer 12.

FIGS. 1 and 1A illustrate two specific arrangements of acoustic surface wave energy absorbing material on the active electrodes of an input transducer. The location of the energy absorbing material may be varied as desired and may be determined by trial-and-error. The energy absorbing material is not placed forward of the electrodes having the maximum amount of overlap (21 in FIG. 1 and 42 in FIG. 1A), since a major portion of the desired signal is produced in that portion of the transducer. Backward traveling waves generated in that portion, however, are suppressed by the energy absorbing material.

Figure 2:
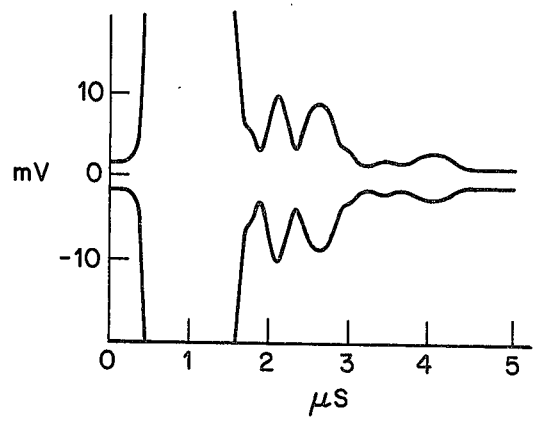
FIG. 2 is a curve illustrating the impulse response of an acoustic surface wave device similar to that of FIG. 1 but without acoustic surface wave absorbing material on the active electrodes of the input transducer.

In one specific embodiment devices as illustrated schematically in FIG. 1 suitable for use as intermediate frequency filters in television receivers were fabricated. The substrate was 128° Y-rotate X-propagation lithium niobate. The devices included an apodized input transducer 11 of 970 ns in length and an output transducer of 270 ns. A pulse modulated signal of 300 ns in width was applied to the input transducer of a device without energy absorbing material on the active electrodes of the input transducer. The result is shown in FIG. 2. A similar pulse was applied to the input transducer of a similar device having a layer of energy absorbing material overlying the electrodes backward of the maximum overlap, as illustrated in FIG. 1. The energy absorbing material was apeizon wax and was 5 to 15 mils thick. The result is shown in FIG. 3.

Figure 3:
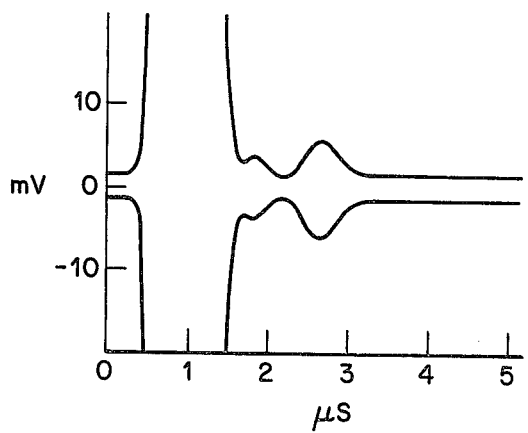
FIG. 3 is a curve illustrating the impulse response of an acoustic surface wave device in accordance with the present invention as illustrated in FIG. 1.

The two impulse responses as shown in FIGS. 2 and 3 indicate that the ideal output signal of approximately 1540 ns in length tends to be more seriously distorted with devices not employing energy absorbing material in accordance with the present invention. The spurious signal immediately following the needed signal is suppressed to less than −60 db in devices in accordance with the invention as shown in FIG. 3, compared to −39 db for devices without energy absorbing material as shown in FIG. 2. In addition, the triple transit echo and its followers are either partially or completely suppressed in devices in accordance with the present invention as shown by comparing FIGS. 2 and 3.

Figure 4:
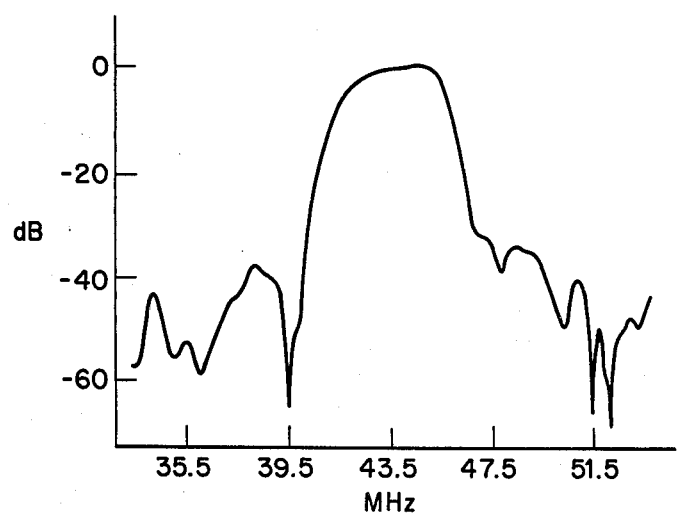
FIG. 4 is a curve illustrating the frequency response corresponding to the impulse response of FIG. 2.
Figure 5:
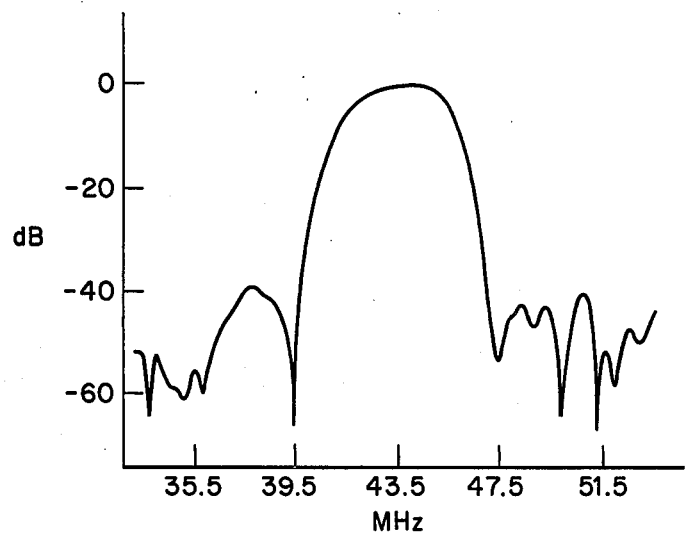
FIG. 5 is a curve illustrating the frequency response corresponding to the impulse response of FIG. 3.

FIGS. 4 and 5 are amplitude versus frequency responses corresponding to the impulse responses of FIGS. 2 and 3, respectively. As shown from a comparison of the figures, with devices in accordance with the present invention the passband is properly shaped, an upper frequency trap is present, and the upper sidelobes are suppressed.

Thus while there have been shown and described what are considered preferred embodiments of the present invention, it will be obvious to those skilled in the art that various changes and modifications may be made therein without departing from the invention as defined by the appended claims.

What is claimed is:

1. An acoustic surface wave device including
    an acoustic surface wave propagating medium;
    an input transducer on a surface of said medium for launching acoustic surface waves along a propagation path in said medium;
    an output transducer on the surface of said medium for receiving and detecting acoustic surface waves propagating along the propagation path from the input transducer;
    said input transducer comprising
        first and second sets of interleaved electrodes of conductive material on the surface of the acoustic surface wave propagating medium with the electrodes extending transversely to the propagation path of acoustic surface waves through the input transducer toward the output transducer,
        portions of electrodes of the first set overlapping portions of electrodes of the second set with the lengths of the overlapping portions varying along the direction of the propagation path, the overlapping portions defining an overlap envelope; and
    acoustic surface wave absorbing material disposed on a region of the electrodes of the input transducer within the overlap envelope and between the electrodes having the maximum amount of overlap and the end of the input transducer remote from the output transducer.

2. An acoustic surface wave device in accordance with claim 1 wherein
    said input transducer includes
        a first bus bar of conductive material on one side of the input transducer extending generally along the direction of the propagation path and connected to the end of each electrode of the first set, and
        a second bus bar of conductive material on the other side of the input transducer extending generally along the direction of the propagation path and connected to the end of each electrode of the second set; and
    said acoustic surface wave absorbing material is disposed on the region of the electrodes of the input transducer extending from adjacent to the electrodes having the maximum amount of overlap to the end of the input transducer remote from the output transducer and from the first bus bar to the second bus bar.

3. An acoustic surface wave device in accordance with claim 2 wherein
    said acoustic surface wave absorbing material is a good absorber of acoustic surface waves and has large internal losses.

4. An acoustic surface wave device in accordance with claim 3 wherein
    said acoustic surface wave propagating medium is of a piezoelectric material selected from the group consisting of lithium niobate, zinc oxide, and PZT.

5. An acoustic surface wave device in accordance with claim 1 wherein
    said input transducer includes
        a first bus bar of conductive material on one side of the input transducer extending generally along the direction of the propagation path and connected to the end of each electrode of the first set, and
        a second bus bar of conductive material on the other side of the input transducer extending generally along the direction of the propagation path and connected to the end of each electrode of the second set, the overlapping portions of the electrodes of the first and second sets defining an overlap envelope with a series of loops; and said acoustic surface wave absorbing material is disposed on the region of the electrodes of the input transducer extending from adjacent to the electrodes at the end of the loop encompassing the electrodes having the maximum amount of overlap to the end of the input transducer remote from the output transducer and from the first bus bar to the second bus bar.

6. An acoustic surface wave device in accordance with claim 5 wherein said acoustic surface wave absorbing material is a good absorber of acoustic surface waves and has large internal losses.

7. An acoustic surface wave device in accordance with claim 6 wherein said acoustic surface wave propagating medium is of a piezoelectric material selected from the group consisting of lithium niobate, zinc oxide, and PZT.

* * * * *